United States Patent
Wu (10) Patent No.: US 9,523,891 B2
(45) Date of Patent: Dec. 20, 2016

(54) DISPLAY PANEL AND MANUFACTURE METHOD THEREOF

(71) Applicant: Shenzhen China Star Optoeletronics Technology Co., Ltd., Shenzhen, Guangdong (CN)

(72) Inventor: Yuchih Wu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 163 days.

(21) Appl. No.: 14/424,013

(22) PCT Filed: Feb. 9, 2015

(86) PCT No.: PCT/CN2015/072491
§ 371 (c)(1),
(2) Date: Feb. 25, 2015

(87) PCT Pub. No.: WO2016/090750
PCT Pub. Date: Jun. 16, 2016

(65) Prior Publication Data
US 2016/0342034 A1 Nov. 24, 2016

(30) Foreign Application Priority Data
Dec. 11, 2014 (CN) .......................... 2014 1 0764697

(51) Int. Cl.
*G02F 1/1343* (2006.01)
*G02F 1/1335* (2006.01)
(Continued)

(52) U.S. Cl.
CPC ....... *G02F 1/134309* (2013.01); *G02F 1/1337* (2013.01); *G02F 1/1368* (2013.01); (Continued)

(58) Field of Classification Search
CPC combination set(s) only.
See application file for complete search history.

(56) References Cited

U.S. PATENT DOCUMENTS

2009/0009671 A1* 1/2009 Wakabayashi .... G02F 1/134363 349/33
2014/0098319 A1* 4/2014 Jeon ................... G02F 1/133707 349/46

\* cited by examiner

*Primary Examiner* — Kyoung Lee
*Assistant Examiner* — Ratisha Mehta
(74) *Attorney, Agent, or Firm* — Andrew C. Cheng (57) ABSTRACT

The present invention provides a display substrate and a manufacture method thereof. The display substrate locates the common electrode (10) above the pixel electrode (20) and overlapping with the pixel electrode (20) on the same substrate (100); the common electrode (10) comprises a first opening (OP1), a second opening (OP2), a third opening (OP3) and a fourth opening (OP4) which are symmetrically located to one another; the first opening (OP1) comprises an eleventh extension part (OP11) extending along a tilt direction, a twelfth extension part (OP12) perpendicular with the eleventh extension part (OP11) and a thirteenth extension part (OP13) perpendicular with the eleventh extension part (OP11), of which the liquid crystal molecules can be aligned along different directions to form multi-domains in a plurality of pixel areas, and thus, the color washout can be improved, and meanwhile, the brightness descend caused by the crystal textures formed at edges of respective domains can be diminished or prevented.

15 Claims, 4 Drawing Sheets

(51) Int. Cl.
  *G02F 1/1368* (2006.01)
  *G02F 1/1362* (2006.01)
  *G02F 1/1337* (2006.01)
  *G02F 1/1333* (2006.01)
  *H01L 27/12* (2006.01)

(52) U.S. Cl.
  CPC .. *G02F 1/133345* (2013.01); *G02F 1/133512* (2013.01); *G02F 1/136227* (2013.01); *G02F 1/136286* (2013.01); *H01L 27/124* (2013.01); *G02F 2001/13629* (2013.01); *G02F 2001/133397* (2013.01); *G02F 2001/134318* (2013.01); *G02F 2001/136295* (2013.01); *G02F 2201/121* (2013.01); *G02F 2201/123* (2013.01)

DISPLAY PANEL AND MANUFACTURE METHOD THEREOF

FIELD OF THE INVENTION

The present invention relates to a display technology field, and more particularly to a display panel and a manufacture method thereof.

BACKGROUND OF THE INVENTION

With the development of display technology, the flat panel device, such as Liquid Crystal Display (LCD) possesses advantages of high image quality, power saving, thin body and no irradiation. Thus, it has been widely applied in various consumer electrical products, such as mobile phone, television, personal digital assistant, digital camera, notebook, laptop, and becomes the major display device.

Most of the liquid crystal displays on the present market are back light type liquid crystal displays, which comprise a shell, a liquid crystal display panel located in the shell and a backlight module located in the shell.

The traditional LCD panel comprises a Thin Film Transistor Array Substrate (TFT Array Substrate) and a Color Filter (CF). The pixel electrode and the common electrode are respectively formed on the TFT substrate and the CF substrate, and Liquid Crystal is injected between the TFT substrate and the CF substrate. The working principle is that the light of backlight module is refracted to generate images by applying driving voltages between the pixel electrode and the common electrode for controlling the rotations of the liquid crystal molecules with the electrical field formed between the pixel electrode and the common electrode. The traditional liquid crystal display panel has defects of the narrow view angle, and the color washout phenomenon under wide view angle.

For expanding the view angle of the liquid crystal display panel, a Plane-to-Line Switching (PLS) liquid crystal display panel is proposed. The PLS liquid crystal display panel is to locate the pixel electrode and the common electrode on the same substrate, and the vertical electrical field formed between the pixel electrode and the common electrode is employed to drive the liquid crystal molecules to rotate along the direction parallel with the substrate to expand the view angle. However, in the PLS liquid crystal display panel, all the liquid crystal molecules are aligned along the same direction, which can cause that the colors shown by the PLS liquid crystal display panel will change from the different watch angles and create the color washout phenomenon. Generally, the color washout is improved by utilizing the method of forming multi-domains in single pixel unit. Nevertheless, as the method is applied to the PLS liquid crystal display panel, the crystal textures are formed at edges of respective domains. Accordingly, the brightness descends and the display effect is influenced.

SUMMARY OF THE INVENTION

An objective of the present invention is to provide a display substrate, of which the liquid crystal molecules can be aligned along different directions to form multi-domains in a plurality of pixel areas, and thus, the color washout can be improved, and meanwhile, the brightness descend caused by the crystal textures formed at edges of respective domains can be diminished or prevented.

Another objective of the present invention is to provide a manufacture method of a display substrate, and in the display substrate manufactured by the method, the liquid crystal molecules can be aligned along different directions to form multi-domains in a plurality of pixel areas, and thus, the color washout can be improved, and meanwhile, the brightness descend caused by the crystal textures formed at edges of respective domains can be diminished or prevented.

For realizing the aforesaid objective, the present invention provides a display substrate, comprising a substrate, a plurality of TFTs arranged in array on the substrate, gate lines electrically coupled to the TFTs and arranged along a horizontal direction, data lines electrically coupled to the TFTs and arranged along a vertical direction, pixel electrodes electrically coupled to the TFTs and common electrodes located above the pixel electrodes and overlap with the pixel electrodes;

the gate lines and the data lines crisscross to one another to define a plurality of pixel areas arranged in array, and each pixel area comprises one pixel electrode, and each TFT correspondingly drives one pixel area;

the common electrode comprises a first opening, and a second opening symmetrical to the first opening relative to the gate line; the first opening overlaps with a first pixel area in the plurality of pixel areas, and the second opening overlaps with a second pixel area adjacent to the first pixel area in the vertical direction;

the first opening comprises an eleventh extension part extending along a tilt direction, and a twelfth extension part extending from one end of the eleventh extension part and being perpendicular with the eleventh extension part, a thirteenth extension part extending from the other end of the eleventh extension part and being perpendicular with the eleventh extension part; and the extension directions of the twelfth extension part and the thirteenth extension part are opposite.

All the eleventh extension part, the twelfth extension part and the thirteenth extension part overlap with the pixel electrode.

The common electrode further comprises a third opening symmetrical to the first opening relative to the data line, a fourth opening symmetrical to the second opening relative to the data line; the third opening overlaps a third pixel area adjacent to the first pixel area in the horizontal direction, and the fourth opening overlaps a fourth pixel area adjacent to the third pixel area in the vertical direction and adjacent to the second pixel area in the horizontal direction.

The display substrate further comprises: a light shielding layer located on the substrate, a first insulative layer located on the light shielding layer, a semiconductor layer located on the first insulative layer, a second insulative layer located on the semiconductor layer, a gate located on the second insulative layer, a third insulative layer located on the gate, a source and a drain respectively located at two sides of the gate and separated with the second insulative layer and the third insulative layer;

both the source and the drain contact the semiconductor layer, and form electrical connections to the semiconductor layer;

the gate lines and the gate are in the same layer; the data lines, the source and the drain are in the same layer;

the semiconductor layer, the gate, the source and the drain form the TFTs.

The source and the drain respectively contact the semiconductor layer via a first via hole and a second via hole penetrating the second insulative layer and the third insulative layer.

The gate lines are electrically coupled to the gates of the TFTs, and the data lines are electrically coupled to the sources of the TFTs.

The display substrate further comprises a fourth insulative layer located on the source, the drain, a fifth insulative layer located between the fourth insulative layer and the pixel electrode, a sixth insulative layer located between the pixel electrode and the common electrode and a lower alignment layer located on the common electrode;

the pixel electrode contacts the drain to form electrical connection.

The pixel electrode contacts the drain via a third via hole penetrating the fourth insulative layer and the fifth insulative layer.

The present invention further provides a manufacture method of a display substrate, comprising steps of:

step 1, providing a substrate, and sequentially forming a light shielding layer, a first insulative layer, a semiconductor layer, a second insulative layer;

step 2, forming a first metal layer on the second insulative layer and patterning the first metal layer to form a gate and a gate line;

the gate line is electrically coupled to the gate;

step 3, forming a third insulative layer on the second insulative layer, which covers the gate and the gate lines, and patterning the second insulative layer and the third insulative layer to form a first via hole, a second via hole respectively located at two sides of the gate;

step 4, forming a second metal layer on the third insulative layer and patterning the second metal layer to form a source, a drain and data lines;

the source and the drain respectively contact the semiconductor layer via the first via hole, the second via hole and form electrical connections to the semiconductor layer;

the data line is electrically coupled to the source;

the semiconductor layer, the gate, the source and the drain form the TFTs;

the gate lines and the data lines crisscross to one another to define a plurality of pixel areas arranged in array, and each TFT correspondingly drives one pixel area;

step 5, sequentially forming a fourth insulative layer covering the source, the drain and the data lines on the third insulative layer, a fifth insulative layer covering the fourth insulative layer, and patterning the fourth insulative layer and the fifth insulative layer to form a third via hole;

step 6, forming and patterning a pixel electrode on the fifth insulative layer to make each pixel area comprise one pixel electrode;

the pixel electrode contacts the drain via the third via hole to form electrical connection;

step 7, forming a sixth insulative layer covering the pixel electrode on the fifth insulative layer;

step 8, forming and patterning a common electrode on the sixth insulative layer;

the common electrode is located above the pixel electrode and overlaps with the pixel electrode;

the common electrode comprises a first opening, and a second opening symmetrical to the first opening relative to the gate line; the first opening overlaps with a first pixel area in the plurality of pixel areas, and the second opening overlaps with a second pixel area adjacent to the first pixel area in the vertical direction;

the first opening comprises an eleventh extension part extending along a tilt direction, and a twelfth extension part extending from one end of the eleventh extension part and being perpendicular with the eleventh extension part, a thirteenth extension part extending from the other end of the eleventh extension part and being perpendicular with the eleventh extension part; and the extension directions of the twelfth extension part and the thirteenth extension part are opposite;

step 9, forming a lower alignment layer on the common electrode.

All the eleventh extension part, the twelfth extension part and the thirteenth extension part overlap with the pixel electrode; the common electrode further comprises a third opening symmetrical to the first opening relative to the data line, a fourth opening symmetrical to the second opening relative to the data line; the third opening overlaps a third pixel area adjacent to the first pixel area in the horizontal direction, and the fourth opening overlaps a fourth pixel area adjacent to the third pixel area in the vertical direction and adjacent to the second pixel area in the horizontal direction.

The present invention further provides a display substrate, comprising a substrate, a plurality of TFTs arranged in array on the substrate, gate lines electrically coupled to the TFTs and arranged along a horizontal direction, data lines electrically coupled to the TFTs and arranged along a vertical direction, pixel electrodes electrically coupled to the TFTs and common electrodes located above the pixel electrodes and overlap with the pixel electrodes;

the gate lines and the data lines crisscross to one another to define a plurality of pixel areas arranged in array, and each pixel area comprises one pixel electrode, and each TFT correspondingly drives one pixel area;

the common electrode comprises a first opening, and a second opening symmetrical to the first opening relative to the gate line; the first opening overlaps with a first pixel area in the plurality of pixel areas, and the second opening overlaps with a second pixel area adjacent to the first pixel area in the vertical direction;

the first opening comprises an eleventh extension part extending along a tilt direction, and a twelfth extension part extending from one end of the eleventh extension part and being perpendicular with the eleventh extension part, a thirteenth extension part extending from the other end of the eleventh extension part and being perpendicular with the eleventh extension part; and the extension directions of the twelfth extension part and the thirteenth extension part are opposite;

wherein all the eleventh extension part, the twelfth extension part and the thirteenth extension part overlap with the pixel electrode;

wherein the common electrode further comprises a third opening symmetrical to the first opening relative to the data line, a fourth opening symmetrical to the second opening relative to the data line; the third opening overlaps a third pixel area adjacent to the first pixel area in the horizontal direction, and the fourth opening overlaps a fourth pixel area adjacent to the third pixel area in the vertical direction and adjacent to the second pixel area in the horizontal direction;

wherein the display substrate further comprises: a light shielding layer located on the substrate, a first insulative layer located on the light shielding layer, a semiconductor layer located on the first insulative layer, a second insulative layer located on the semiconductor layer, a gate located on the second insulative layer, a third insulative layer located on the gate, a source and a drain respectively located at two sides of the gate and separated with the second insulative layer and the third insulative layer;

both the source and the drain contact the semiconductor layer, and form electrical connections to the semiconductor layer;

the gate lines and the gate are in the same layer; the data lines, the source and the drain are in the same layer;

the semiconductor layer, the gate, the source and the drain form the TFTs.

The benefits of the present invention are: the present invention provides a display substrate and a manufacture method thereof, the common electrode being above the pixel electrode and overlapping with the pixel electrode is located on the same substrate, and the common electrode comprises a first opening, a second opening, a third opening and a fourth opening which are symmetrically located to one another, and the first opening comprises an eleventh extension part extending along a tilt direction, a twelfth extension part perpendicular with the eleventh extension part and a thirteenth extension part perpendicular with the eleventh extension part, of which the liquid crystal molecules can be aligned along different directions to form multi-domains in a plurality of pixel areas, and thus, the color washout can be improved, and meanwhile, the brightness descend caused by the crystal textures formed at edges of respective domains can be diminished or prevented.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

The present invention first provides a display substrate, and the display substrate is applied in a PLS liquid crystal display panel. Please refer to FIG. 1 and FIG. 2. The display substrate of the present invention comprises a substrate 100, a plurality of TFTs arranged in array on the substrate 100, gate lines GL electrically coupled to the TFTs and arranged along a horizontal direction, data lines DL electrically coupled to the TFTs and arranged along a vertical direction, pixel electrodes 20 electrically coupled to the TFTs and common electrodes 10 located above the pixel electrodes 20 and overlap with the pixel electrodes 20. The gate lines GL and the data lines DL crisscross to one another to define a plurality of pixel areas arranged in array, and each pixel area comprises one pixel electrode 20, and each TFT correspondingly drives one pixel area.

Figure 1:
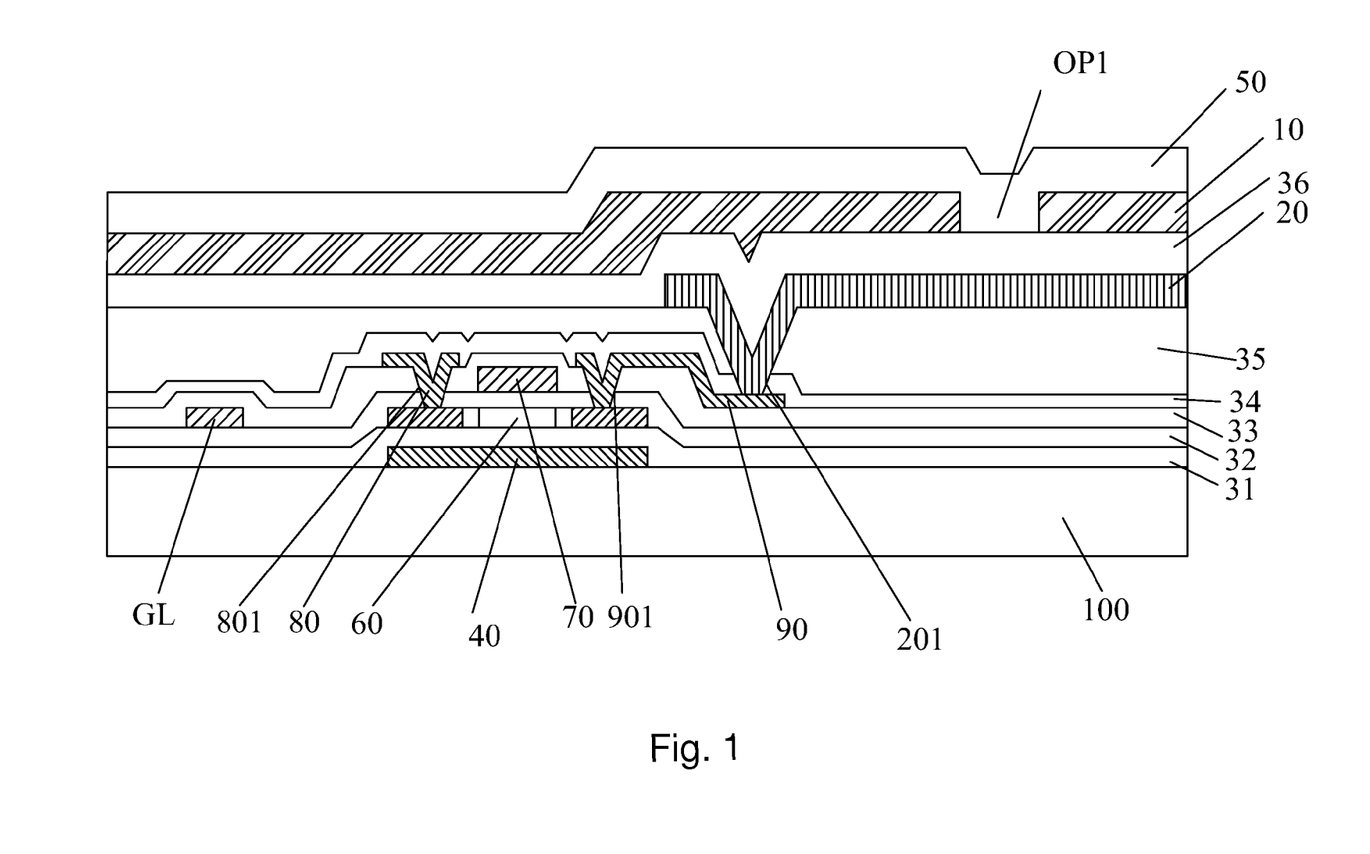
FIG. 1 is a sectional diagram of a display substrate according to the present invention.
Figure 2:
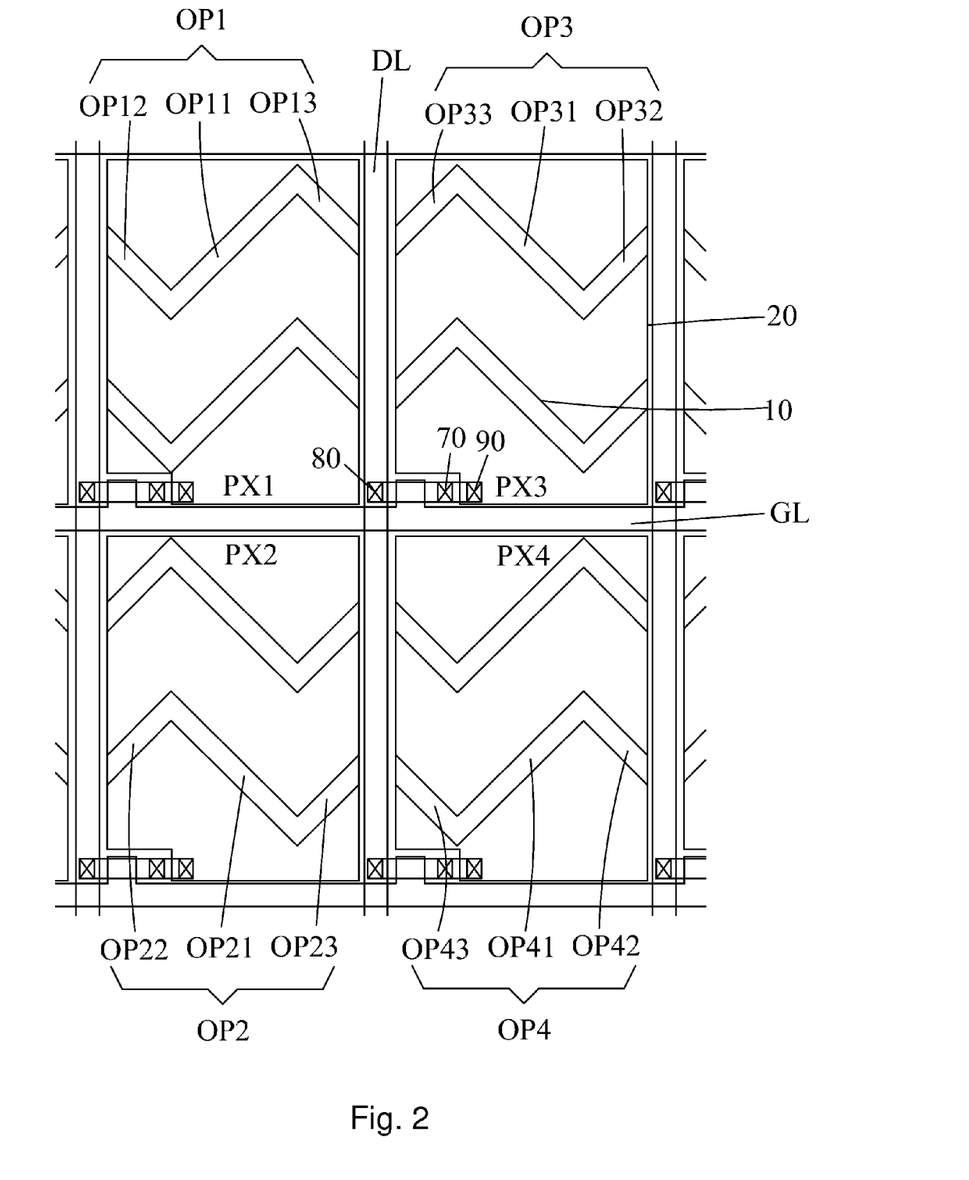
FIG. 2 is a plane diagram of a display substrate according to the present invention.

The common electrode 10 comprises a first opening OP1, and a second opening OP2 symmetrical to the first opening OP1 relative to the gate line GL. The first opening OP1 overlaps with a first pixel area PX1 in the plurality of pixel areas, and the second opening OP2 overlaps with a second pixel area PX2 adjacent to the first pixel area PX1 in the vertical direction.

The first opening OP1 comprises an eleventh extension part OP11 extending along a tilt direction, a twelfth extension part OP12 extending from one end of the eleventh extension part OP11 and being perpendicular with the eleventh extension part OP11, a thirteenth extension part OP13 extending from the other end of the eleventh extension part OP11 and being perpendicular with the eleventh extension part OP11, all the eleventh extension part OP11, the twelfth extension part OP12 and the thirteenth extension part OP13 overlap with the pixel electrode 20, and the extension direction of the eleventh extension part OP11 is different from directions of the gate lines GL and data lines DL, i.e. tilted with both the horizontal direction and the vertical direction, and the extension directions of the twelfth extension part OP12 and the thirteenth extension part OP13 are opposite.

The second opening OP2 and the first opening OP1 are symmetrical relative to the gate line GL, and correspondingly, the second opening OP2 comprises a twenty-first extension part OP21, a twenty-second extension part OP22 extending from one end of the twenty-first extension part OP21 and being perpendicular with the twenty-first extension part OP21, a twenty-third extension part OP23 extending from the other end of the twenty-first extension part OP21 and being perpendicular with the twenty-first extension part OP21.

The common electrode 10 further comprises a third opening OP3 symmetrical to the first opening OP1 relative to the data line DL and a fourth opening OP4 symmetrical to the second opening OP2 relative to the data line DL. The third opening OP3 overlaps a third pixel area PX3 adjacent to the first pixel area PX1 in the horizontal direction, and the fourth opening OP4 overlaps a fourth pixel area PX4 adjacent to the third pixel area PX3 in the vertical direction and adjacent to the second pixel area PX2 in the horizontal direction. The third opening OP3 has the same appearance as the second opening OP2, and correspondingly comprises a thirty-first extension part OP31, a thirty-second extension part OP32 extending from one end of the thirty-first extension part OP31 and being perpendicular with the thirty-first extension part OP31, a thirty-third extension part OP33 extending from the other end of the thirty-first extension part OP31 and being perpendicular with the thirty-first extension part OP31; the fourth opening OP4 has the same appearance as the first opening OP1, and correspondingly comprises a forty-first extension part OP41, a forty-second extension part OP42 extending from one end of the forty-first extension part OP41 and being perpendicular with the forty-first extension part OP41, a forty-third extension part OP43 extending from the other end of the forty-first extension part OP41 and being perpendicular with the forty-first extension part OP41.

The common electrode comprises a repeat unit, and the repeat unit corresponds to four pixel areas in two adjacent rows and two adjacent columns which crisscross with the two adjacent rows.

The display substrate further comprises: a light shielding layer 40 located on the substrate 100, a first insulative layer 31 located on the light shielding layer 40, a semiconductor layer 60 located on the first insulative layer 31, a second insulative layer 32 located on the semiconductor layer 60, a gate 70 located on the second insulative layer 32, a third insulative layer 33 located on the gate 70, a source 80 and a drain 90 respectively located at two sides of the gate 70 and separated with the second insulative layer 32 and the third insulative layer 33, a fourth insulative layer 34 located on the source 80, the drain 90, a fifth insulative layer 35 located between the fourth insulative layer 34 and the pixel electrode 20, a sixth insulative layer 36 located between the pixel electrode 20 and the common electrode 10 and a lower alignment layer 50 located on the common electrode 10.

The source 80 and the drain 90 respectively contact the semiconductor layer 60 via a first via hole 801 and a second via hole 901 penetrating the second insulative layer 32 and the third insulative layer 33 to form electrical connections to the semiconductor layer 60.

The gate lines GL and the gate 70 are in the same layer, and the gate lines GL are electrically coupled to the gates 70 of the TFTs; the data lines DL, the source 80 and the drain 90 are in the same layer, and the data lines DL are electrically coupled to the sources 80 of the TFTs.

The semiconductor layer 60, the gate 70, the source 80 and the drain 90 form the TFTs.

The pixel electrode 20 contacts the drain 90 via a third via hole 201 penetrating the fourth insulative layer 34 and the fifth insulative layer 35 to form electrical connection.

Figure 3:
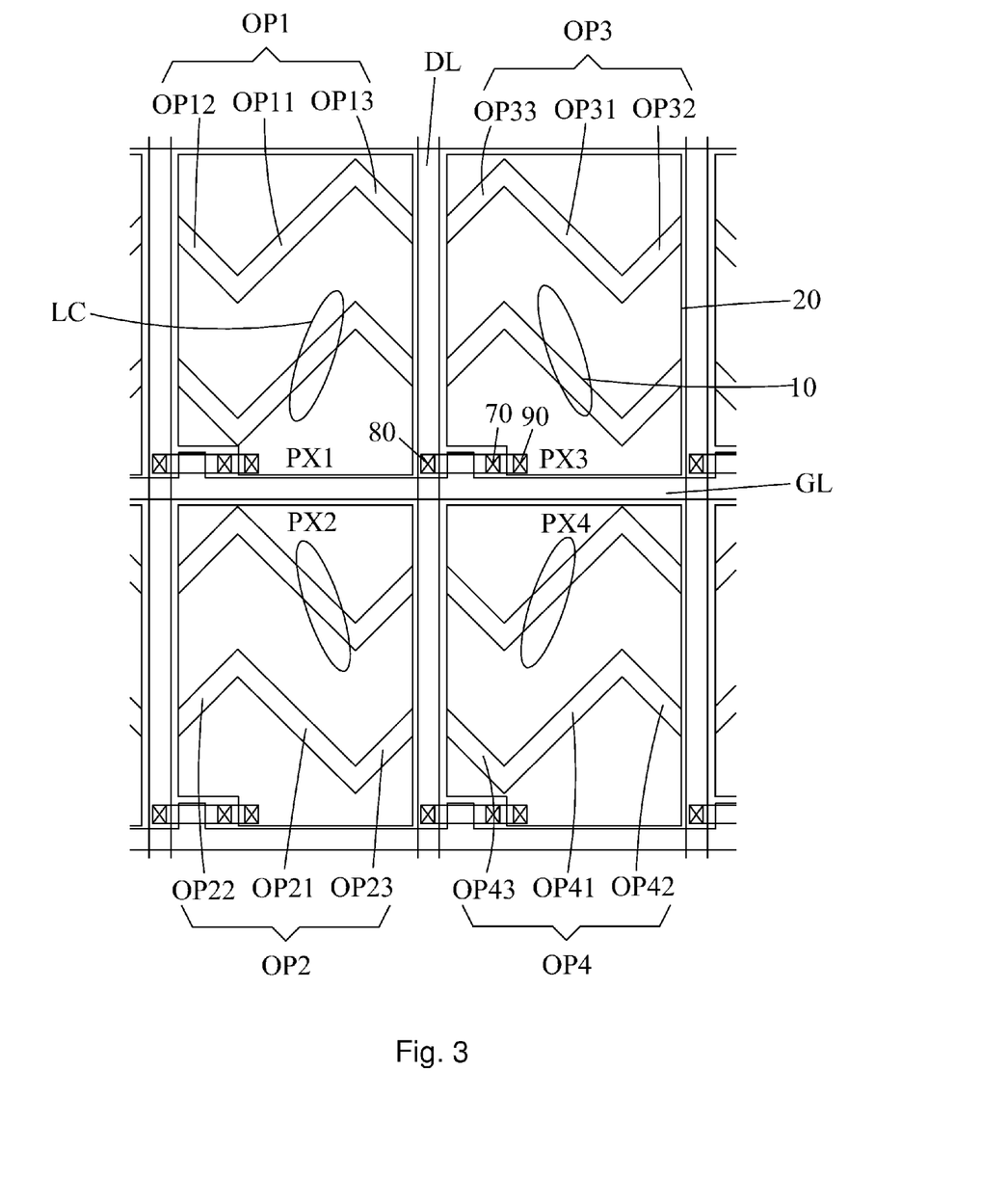
FIG. 3 is a plane diagram of twisted directions of liquid crystal molecules aligned on the display substrate according to the present invention.

AS shown in FIG. 3, as the pixel electrodes 10 are applied with voltages, the liquid crystal molecules LC are twisted according to the electric field formed between the pixel electrodes 10 and the common electrodes 20. Because the common electrode 10 comprises a first opening OP1, a second opening OP2, a third opening OP3 and a fourth opening OP4, and the first opening OP1 comprises an eleventh extension part OP11 extending along a tilt direction, a twelfth extension part OP12 perpendicular with the eleventh extension part OP11 and a thirteenth extension part OP13 perpendicular with the eleventh extension part OP11, the liquid crystal molecules LC corresponding to the first pixel area PX1, the second pixel area PX2, the third pixel area PX3, the fourth pixel area PX4 can be aligned along different directions to form multi-domains in a plurality of pixel areas, and thus, the color washout can be improved, and meanwhile, the brightness descend caused by the crystal textures formed at edges of respective domains can be diminished or prevented.

Figure 4:
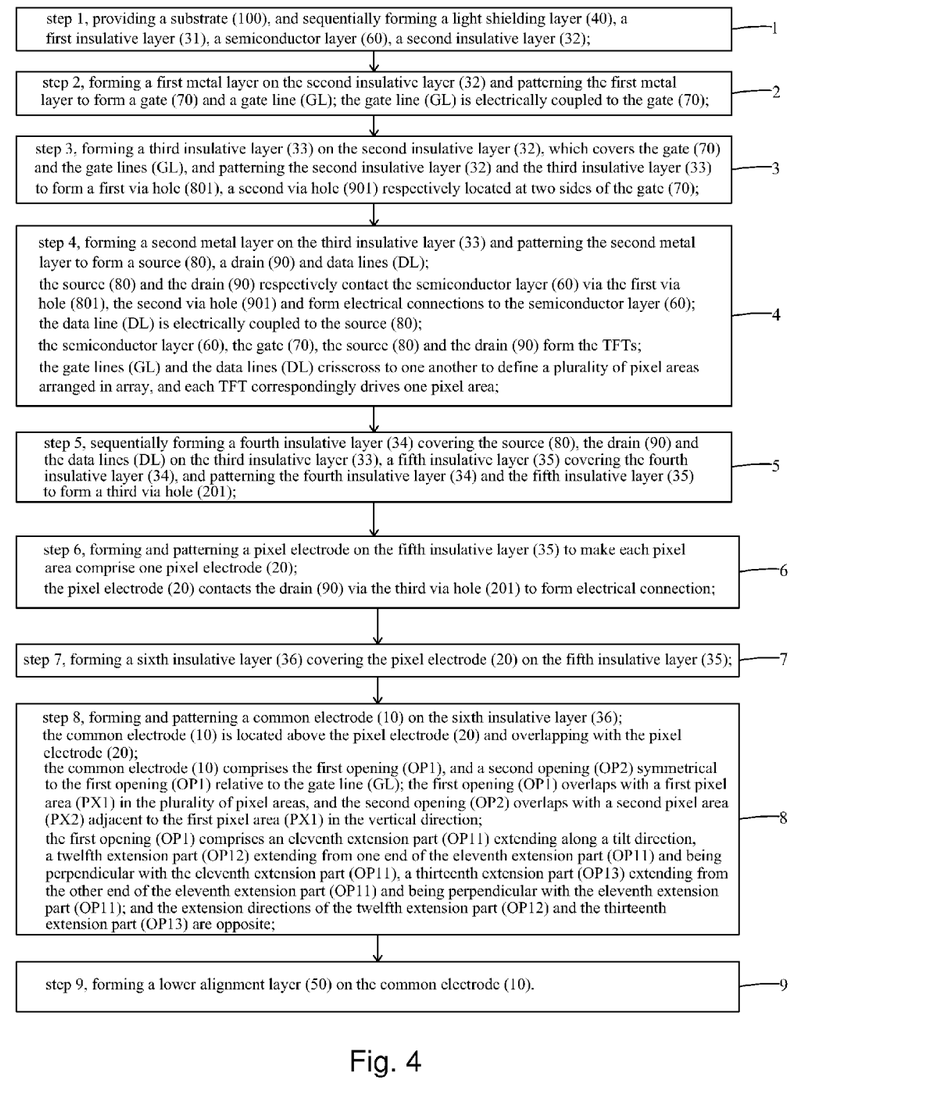
FIG. 4 is a flowchart of a manufacture method of the display substrate according to the present invention.

Please refer to FIG. 4 in combination with FIG. 1, FIG. 2, and the present invention further provides a manufacture method of a display substrate, comprising steps of:

step 1, providing a substrate 100, and sequentially forming a light shielding layer 40, a first insulative layer 31, a semiconductor layer 60, a second insulative layer 32.

step 2, forming a first metal layer on the second insulative layer 32 and patterning the first metal layer to form a gate 70 and a gate line GL;

the gate line GL is electrically coupled to the gate 70.

step 3, forming a third insulative layer 33 on the second insulative layer 32, which covers the gate 70 and the gate lines GL, and patterning the second insulative layer 32 and the third insulative layer 33 to form a first via hole 801, a second via hole 901 respectively located at two sides of the gate 70.

step 4, forming a second metal layer on the third insulative layer 33 and patterning the second metal layer to form a source 80, a drain 90 and data lines DL.

The source 80 and the drain 90 respectively contact the semiconductor layer 60 via the first via hole 801, the second via hole 901 and form electrical connections to the semiconductor layer 60.

The data line DL is electrically coupled to the source 80.

The semiconductor layer 60, the gate 70, the source 80 and the drain 90 form the TFTs.

The gate lines GL and the data lines DL crisscross to one another to define a plurality of pixel areas arranged in array, and each TFT correspondingly drives one pixel area.

step 5, sequentially forming a fourth insulative layer 34 covering the source 80, the drain 90 and the data lines DL on the third insulative layer 33, a fifth insulative layer 35 covering the fourth insulative layer 34, and patterning the fourth insulative layer 34 and the fifth insulative layer 35 to form a third via hole 201.

step 6, forming and patterning a pixel electrode on the fifth insulative layer 35 to make each pixel area comprise one pixel electrode 20.

The pixel electrode 20 contacts the drain 90 via the third via hole 201 to form electrical connection.

step 7, forming a sixth insulative layer 36 covering the pixel electrode 20 on the fifth insulative layer 35.

step 8, forming and patterning a common electrode 10 on the sixth insulative layer 36.

The common electrode 10 is located above the pixel electrode 20 and overlapping with the pixel electrode 20.

The common electrode 10 comprises the first opening OP1, and a second opening OP2 symmetrical to the first opening OP1 relative to the gate line GL; the first opening OP1 overlaps with a first pixel area PX1 in the plurality of pixel areas, and the second opening OP2 overlaps with a second pixel area PX2 adjacent to the first pixel area PX1 in the vertical direction.

The first opening OP1 comprises an eleventh extension part OP11 extending along a tilt direction, a twelfth extension part OP12 extending from one end of the eleventh extension part OP11 and being perpendicular with the eleventh extension part OP11, a thirteenth extension part OP13 extending from the other end of the eleventh extension part OP11 and being perpendicular with the eleventh extension part OP11; and the extension directions of the twelfth extension part OP12 and the thirteenth extension part OP13 are opposite.

Furthermore, all the eleventh extension part OP11, the twelfth extension part OP12 and the thirteenth extension part OP13 overlap with the pixel electrode 20.

The common electrode 10 further comprises a third opening OP3 symmetrical to the first opening OP1 relative to the data line DL and a fourth opening OP4 symmetrical to the second opening OP2 relative to the data line DL. The third opening OP3 overlaps a third pixel area PX3 adjacent to the first pixel area PX1 in the horizontal direction, and the fourth opening OP4 overlaps a fourth pixel area PX4 adjacent to the third pixel area PX3 in the vertical direction and adjacent to the second pixel area PX2 in the horizontal direction.

step 9, forming a lower alignment layer 50 on the common electrode 10.

With the display substrate manufactured by the method, the liquid crystal molecules can be aligned along different directions to form multi-domains in a plurality of pixel areas, and thus, the color washout can be improved, and meanwhile, the brightness descend caused by the crystal textures formed at edges of respective domains can be diminished or prevented.

In conclusion, a display substrate and a manufacture method thereof of the present invention, locate the common electrode above the pixel electrode and overlapping with the pixel electrode on the same substrate; the common electrode comprises a first opening, a second opening, a third opening and a fourth opening which are symmetrically located to one another; the first opening comprises an eleventh extension part extending along a tilt direction, a twelfth extension part perpendicular with the eleventh extension part and a thirteenth extension part perpendicular with the eleventh extension part, of which the liquid crystal molecules can be aligned along different directions to form multi-domains in a plurality of pixel areas, and thus, the color washout can be improved, and meanwhile, the brightness descend caused by the crystal textures formed at edges of respective domains can be diminished or prevented.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A display substrate, comprising a substrate, a plurality of TFTs arranged in array on the substrate, gate lines electrically coupled to the TFTs and arranged along a horizontal direction, data lines electrically coupled to the TFTs and arranged along a vertical direction, pixel electrodes electrically coupled to the TFTs and common electrodes located above the pixel electrodes and overlap with the pixel electrodes;

the gate lines and the data lines crisscross to one another to define a plurality of pixel areas arranged in array, and each pixel area comprises one pixel electrode, and each TFT correspondingly drives one pixel area;

the common electrode comprises a first opening, and a second opening symmetrical to the first opening relative to the gate line; the first opening overlaps with a first pixel area in the plurality of pixel areas, and the second opening overlaps with a second pixel area adjacent to the first pixel area in the vertical direction;

the first opening comprises an eleventh extension part extending along a tilt direction, and a twelfth extension part extending from one end of the eleventh extension part and being perpendicular with the eleventh extension part, a thirteenth extension part extending from the other end of the eleventh extension part and being perpendicular with the eleventh extension part; and the extension directions of the twelfth extension part and the thirteenth extension part are opposite.

2. The display substrate according to claim 1, wherein all the eleventh extension part, the twelfth extension part and the thirteenth extension part overlap with the pixel electrode.

3. The display substrate according to claim 1, wherein the common electrode further comprises a third opening symmetrical to the first opening relative to the data line, a fourth opening symmetrical to the second opening relative to the data line; the third opening overlaps a third pixel area adjacent to the first pixel area in the horizontal direction, and the fourth opening overlaps a fourth pixel area adjacent to the third pixel area in the vertical direction and adjacent to the second pixel area in the horizontal direction.

4. The display substrate according to claim 1, further comprising: a light shielding layer located on the substrate, a first insulative layer located on the light shielding layer, a semiconductor layer located on the first insulative layer, a second insulative layer located on the semiconductor layer, a gate located on the second insulative layer, a third insulative layer located on the gate, a source and a drain respectively located at two sides of the gate and separated with the second insulative layer and the third insulative layer;

both the source and the drain contact the semiconductor layer, and form electrical connections to the semiconductor layer;

the gate lines and the gate are in the same layer; the data lines, the source and the drain are in the same layer;

the semiconductor layer, the gate, the source and the drain form the TFTs.

5. The display substrate according to claim 4, wherein the source and the drain respectively contact the semiconductor layer via a first via hole and a second via hole penetrating the second insulative layer and the third insulative layer.

6. The display substrate according to claim 5, wherein the gate lines are electrically coupled to the gates of the TFTs, and the data lines are electrically coupled to the sources of the TFTs.

7. The display substrate according to claim 6, further comprising a fourth insulative layer located on the source, the drain, a fifth insulative layer located between the fourth insulative layer and the pixel electrode, a sixth insulative layer located between the pixel electrode and the common electrode and a lower alignment layer located on the common electrode;

the pixel electrode contacts the drain to form electrical connection.

8. The display substrate according to claim 7, wherein the pixel electrode contacts the drain via a third via hole penetrating the fourth insulative layer and the fifth insulative layer.

9. A manufacture method of a display substrate, comprising steps of:

step 1, providing a substrate, and sequentially forming a light shielding layer, a first insulative layer, a semiconductor layer, a second insulative layer;

step 2, forming a first metal layer on the second insulative layer and patterning the first metal layer to form a gate and a gate line;

the gate line is electrically coupled to the gate;

step 3, forming a third insulative layer on the second insulative layer, which covers the gate and the gate lines, and patterning the second insulative layer and the third insulative layer to form a first via hole, a second via hole respectively located at two sides of the gate;

step 4, forming a second metal layer on the third insulative layer and patterning the second metal layer to form a source, a drain and data lines;

the source and the drain respectively contact the semiconductor layer via the first via hole, the second via hole and form electrical connections to the semiconductor layer;

the data line is electrically coupled to the source;

the semiconductor layer, the gate, the source and the drain form the TFTs;

the gate lines and the data lines crisscross to one another to define a plurality of pixel areas arranged in array, and each TFT correspondingly drives one pixel area;

step 5, sequentially forming a fourth insulative layer covering the source, the drain and the data lines on the third insulative layer, a fifth insulative layer covering the fourth insulative layer, and patterning the fourth insulative layer and the fifth insulative layer to form a third via hole;

step 6, forming and patterning a pixel electrode on the fifth insulative layer to make each pixel area comprise one pixel electrode;

the pixel electrode contacts the drain via the third via hole to form electrical connection;

step 7, forming a sixth insulative layer covering the pixel electrode on the fifth insulative layer;

step 8, forming and patterning a common electrode on the sixth insulative layer;

the common electrode is located above the pixel electrode and overlaps with the pixel electrode;

the common electrode comprises a first opening, and a second opening symmetrical to the first opening relative to the gate line; the first opening overlaps with a first pixel area in the plurality of pixel areas, and the second opening overlaps with a second pixel area adjacent to the first pixel area in the vertical direction;

the first opening comprises an eleventh extension part extending along a tilt direction, and a twelfth extension part extending from one end of the eleventh extension part and being perpendicular with the eleventh extension part, a thirteenth extension part extending from the other end of the eleventh extension part and being perpendicular with the eleventh extension part; and the extension directions of the twelfth extension part and the thirteenth extension part are opposite;

step 9, forming a lower alignment layer on the common electrode.

10. The manufacture method of the display substrate according to claim 9, wherein all the eleventh extension part, the twelfth extension part and the thirteenth extension part overlap with the pixel electrode; the common electrode further comprises a third opening symmetrical to the first opening relative to the data line, a fourth opening symmetrical to the second opening relative to the data line; the third opening overlaps a third pixel area adjacent to the first pixel area in the horizontal direction, and the fourth opening overlaps a fourth pixel area adjacent to the third pixel area in the vertical direction and adjacent to the second pixel area in the horizontal direction.

11. A display substrate, comprising a substrate, a plurality of TFTs arranged in array on the substrate, gate lines electrically coupled to the TFTs and arranged along a horizontal direction, data lines electrically coupled to the TFTs and arranged along a vertical direction, pixel electrodes electrically coupled to the TFTs and common electrodes located above the pixel electrodes and overlap with the pixel electrodes;

the gate lines and the data lines crisscross to one another to define a plurality of pixel areas arranged in array, and each pixel area comprises one pixel electrode, and each TFT correspondingly drives one pixel area;

the common electrode comprises a first opening, and a second opening symmetrical to the first opening relative to the gate line; the first opening overlaps with a first pixel area in the plurality of pixel areas, and the second opening overlaps with a second pixel area adjacent to the first pixel area in the vertical direction;

the first opening comprises an eleventh extension part extending along a tilt direction, and a twelfth extension part extending from one end of the eleventh extension part and being perpendicular with the eleventh extension part, a thirteenth extension part extending from the other end of the eleventh extension part and being perpendicular with the eleventh extension part; and the extension directions of the twelfth extension part and the thirteenth extension part are opposite;

wherein all the eleventh extension part, the twelfth extension part and the thirteenth extension part overlap with the pixel electrode;

wherein the common electrode further comprises a third opening symmetrical to the first opening relative to the data line, a fourth opening symmetrical to the second opening relative to the data line; the third opening overlaps a third pixel area adjacent to the first pixel area in the horizontal direction, and the fourth opening overlaps a fourth pixel area adjacent to the third pixel area in the vertical direction and adjacent to the second pixel area in the horizontal direction;

wherein the display substrate further comprises: a light shielding layer located on the substrate, a first insulative layer located on the light shielding layer, a semiconductor layer located on the first insulative layer, a second insulative layer located on the semiconductor layer, a gate located on the second insulative layer, a third insulative layer located on the gate, a source and a drain respectively located at two sides of the gate and separated with the second insulative layer and the third insulative layer;

both the source and the drain contact the semiconductor layer, and form electrical connections to the semiconductor layer;

the gate lines and the gate are in the same layer; the data lines, the source and the drain are in the same layer;

the semiconductor layer, the gate, the source and the drain form the TFTs.

12. The display substrate according to claim 11, wherein the source and the drain respectively contact the semiconductor layer via a first via hole and a second via hole penetrating the second insulative layer and the third insulative layer.

13. The display substrate according to claim 11, wherein the gate lines are electrically coupled to the gates of the TFTs, and the data lines are electrically coupled to the sources of the TFTs.

14. The display substrate according to claim 11, further comprising a fourth insulative layer located on the source, the drain, a fifth insulative layer located between the fourth insulative layer and the pixel electrode, a sixth insulative layer located between the pixel electrode and the common electrode and a lower alignment layer located on the common electrode;

the pixel electrode contacts the drain to form electrical connection.

15. The display substrate according to claim 14, wherein the pixel electrode contacts the drain via a third via hole penetrating the fourth insulative layer and the fifth insulative layer.

* * * * *